(12) United States Patent
Blanchard

(10) Patent No.: US 7,599,211 B2
(45) Date of Patent: Oct. 6, 2009

(54) INTEGRATED CIRCUIT, RESISTIVITY CHANGING MEMORY DEVICE, MEMORY MODULE AND METHOD OF FABRICATING AN INTEGRATED CIRCUIT

(75) Inventor: Philippe Blanchard, Moigny sur Ecole (FR)

(73) Assignee: Infineon Technologies AG, Neubiberg (DE)

( * ) Notice: Subject to any disclaimer, the term of this patent is extended or adjusted under 35 U.S.C. 154(b) by 162 days.

(21) Appl. No.: 11/733,651

(22) Filed: Apr. 10, 2007

(65) Prior Publication Data

US 2008/0253164 A1    Oct. 16, 2008

(51) Int. Cl.
   *G11C 7/00* (2006.01)
(52) U.S. Cl. .................................... 365/148; 365/163
(58) Field of Classification Search .............. 365/148, 365/163
   See application file for complete search history.

(56) References Cited

U.S. PATENT DOCUMENTS

| 5,252,516 | A | 10/1993 | Nguyen et al. | |
|---|---|---|---|---|
| 6,770,531 | B2 * | 8/2004 | Lowrey et al. | 438/257 |
| 6,928,022 | B2 * | 8/2005 | Cho et al. | 365/225.7 |
| 7,259,040 | B2 | 8/2007 | Pellizer et al. | |
| 2003/0020163 | A1 | 1/2003 | Hung et al. | |
| 2005/0064606 | A1 | 3/2005 | Pellizzer et al. | |
| 2005/0174861 | A1 | 8/2005 | Kim et al. | |
| 2005/0287698 | A1 * | 12/2005 | Li et al. | 438/102 |
| 2006/0256608 | A1 * | 11/2006 | Chen et al. | 365/148 |
| 2006/0278921 | A1 | 12/2006 | Pellizzer et al. | |
| 2007/0045606 | A1 | 3/2007 | Magistretti et al. | |
| 2007/0200108 | A1 * | 8/2007 | Noh et al. | 257/4 |
| 2008/0019170 | A1 * | 1/2008 | Happ et al. | 365/163 |

FOREIGN PATENT DOCUMENTS

| DE | 33 36 439 | A1 | 5/1984 |
|---|---|---|---|
| EP | 1 505 656 | B1 | 2/2005 |
| EP | 1 717 861 | A1 | 11/2006 |
| GB | 2 130 025 | A | 5/1984 |

* cited by examiner

*Primary Examiner*—Vu A Le
(74) *Attorney, Agent, or Firm*—Slater & Matsil, L.L.P.

(57) ABSTRACT

According to one embodiment of the present invention, an integrated circuit includes a plurality of resistivity changing memory cells, and a plurality of conductive elements being electrically connected to the resistivity changing memory cells, at least some of the conductive elements comprising copper.

21 Claims, 8 Drawing Sheets

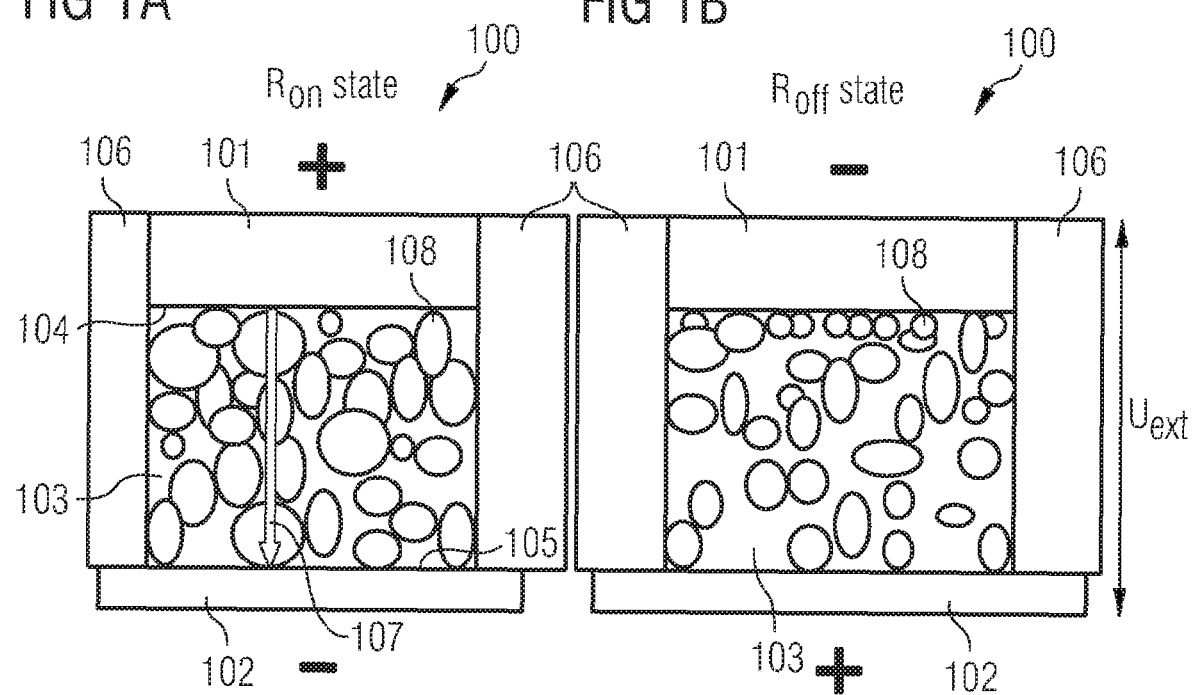

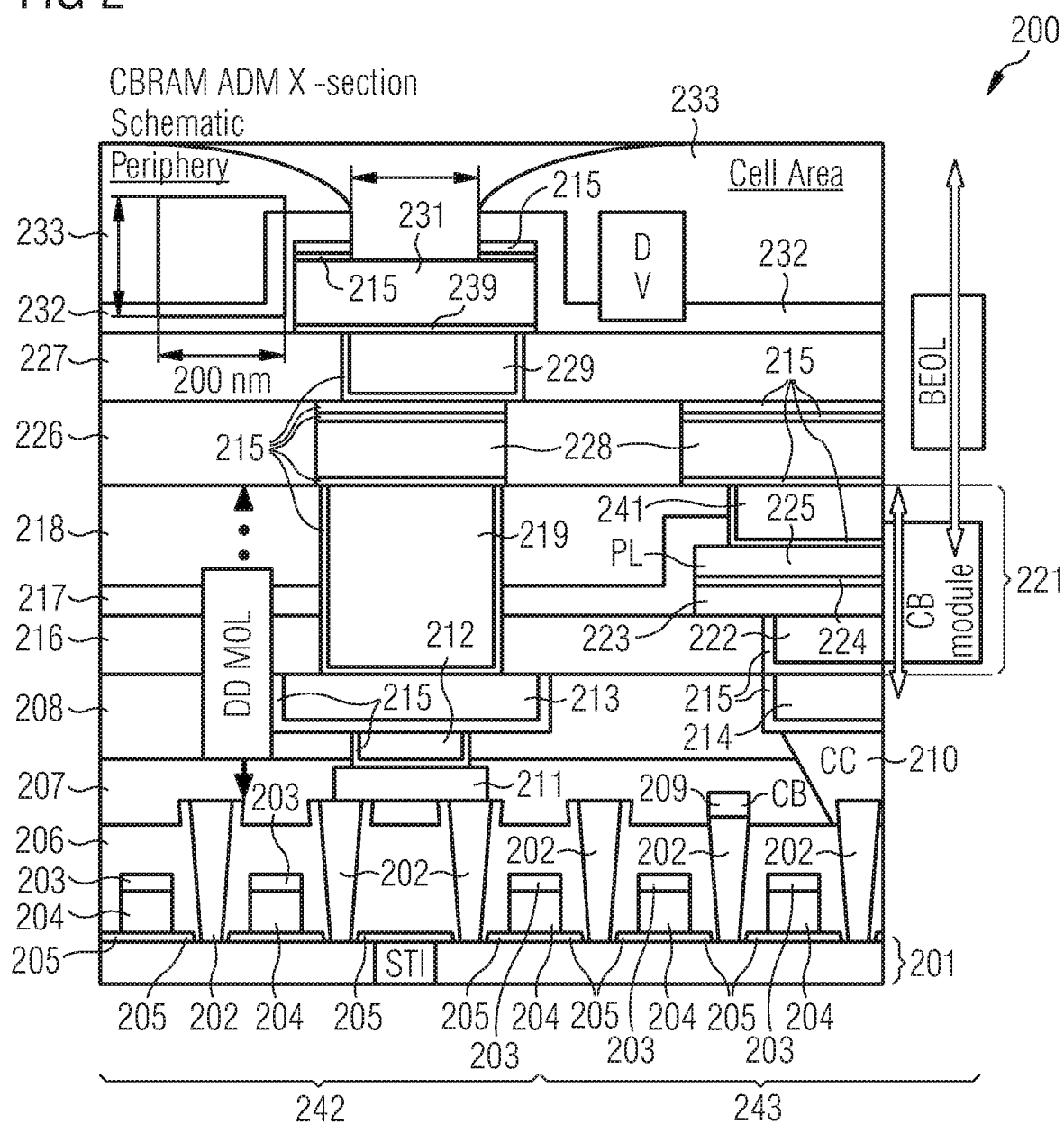

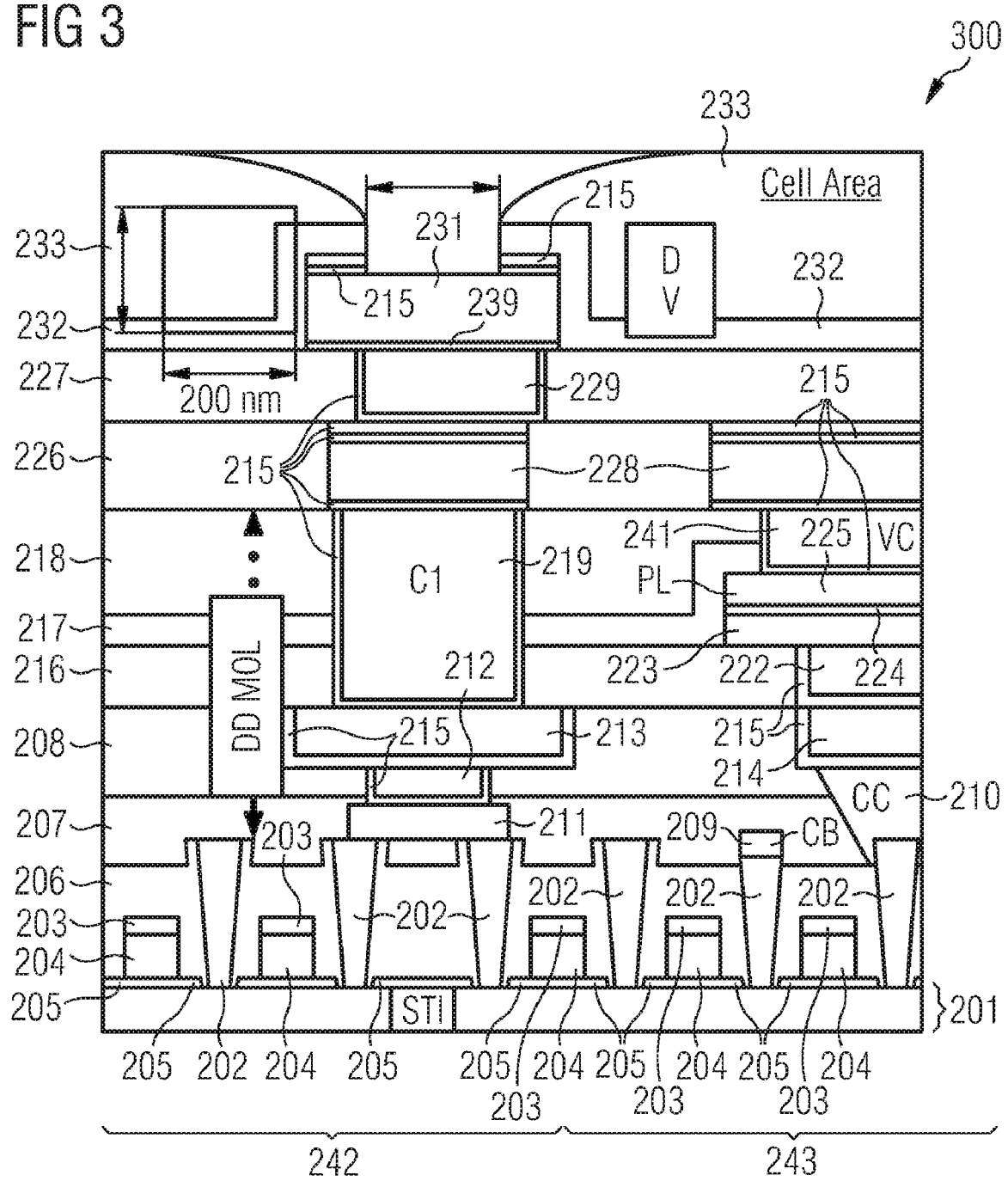

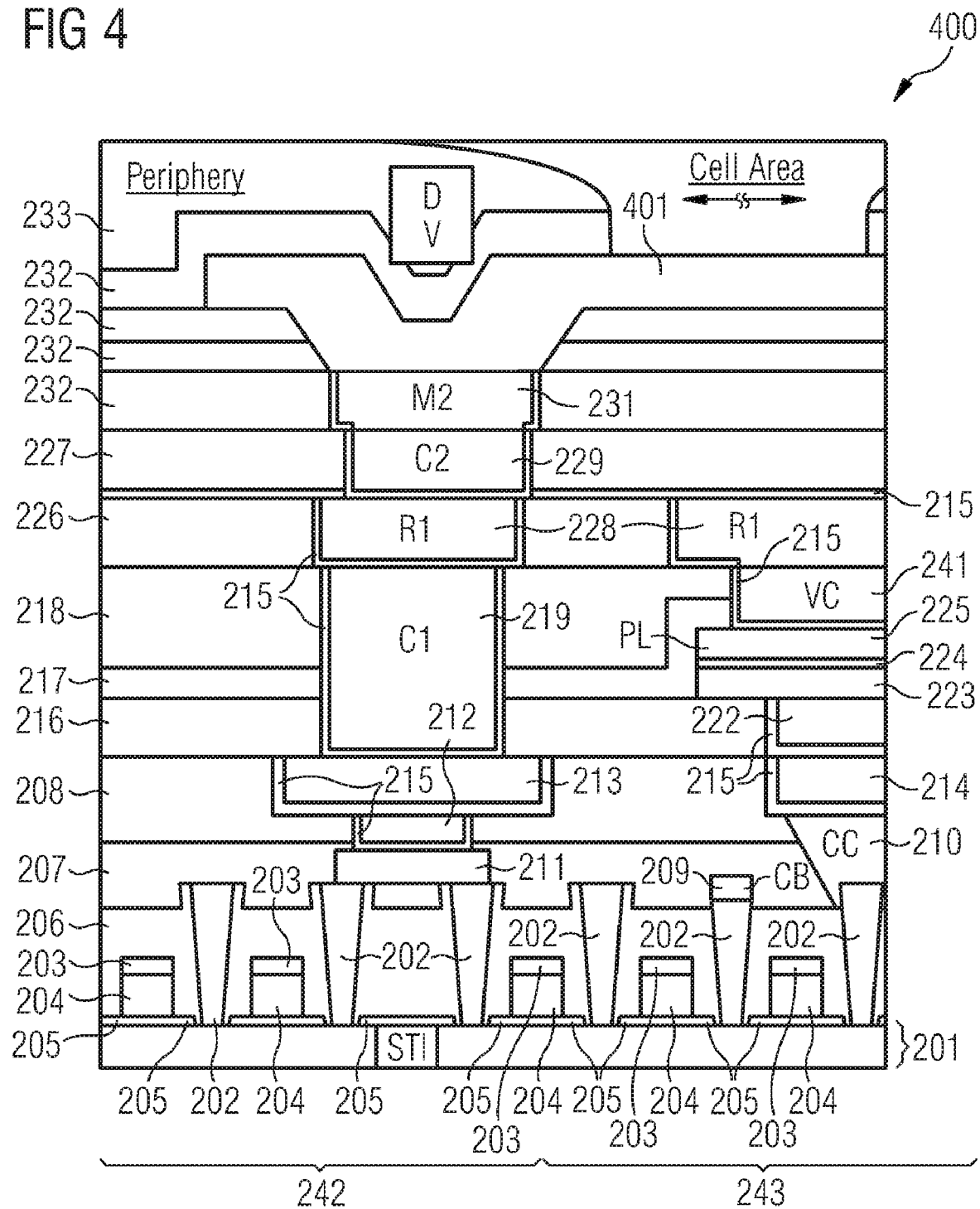

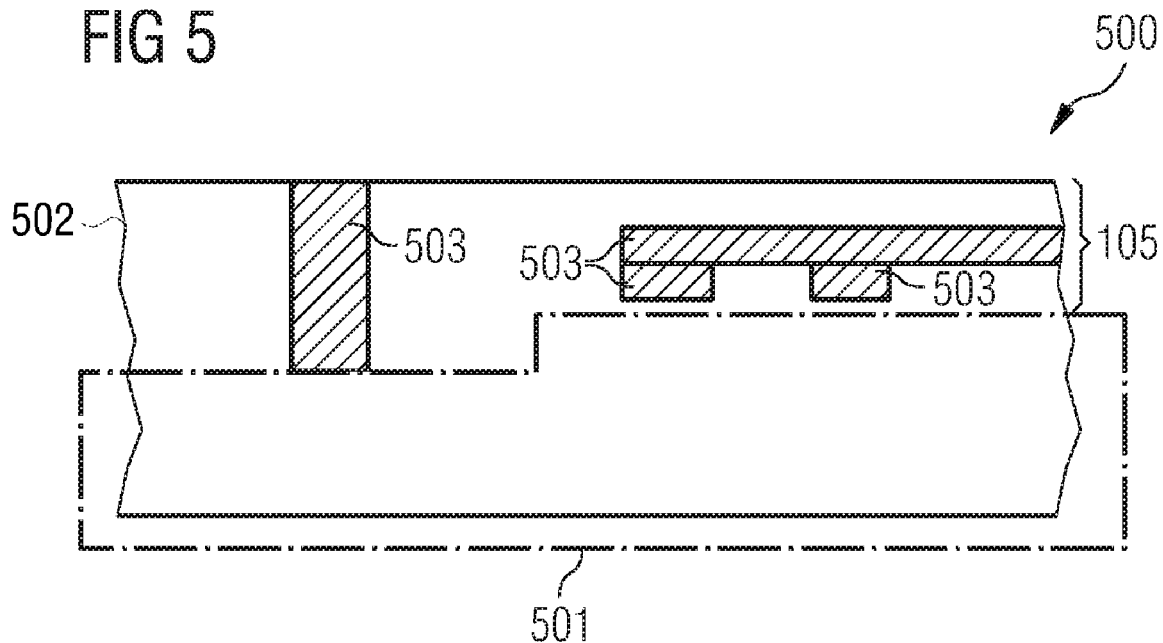
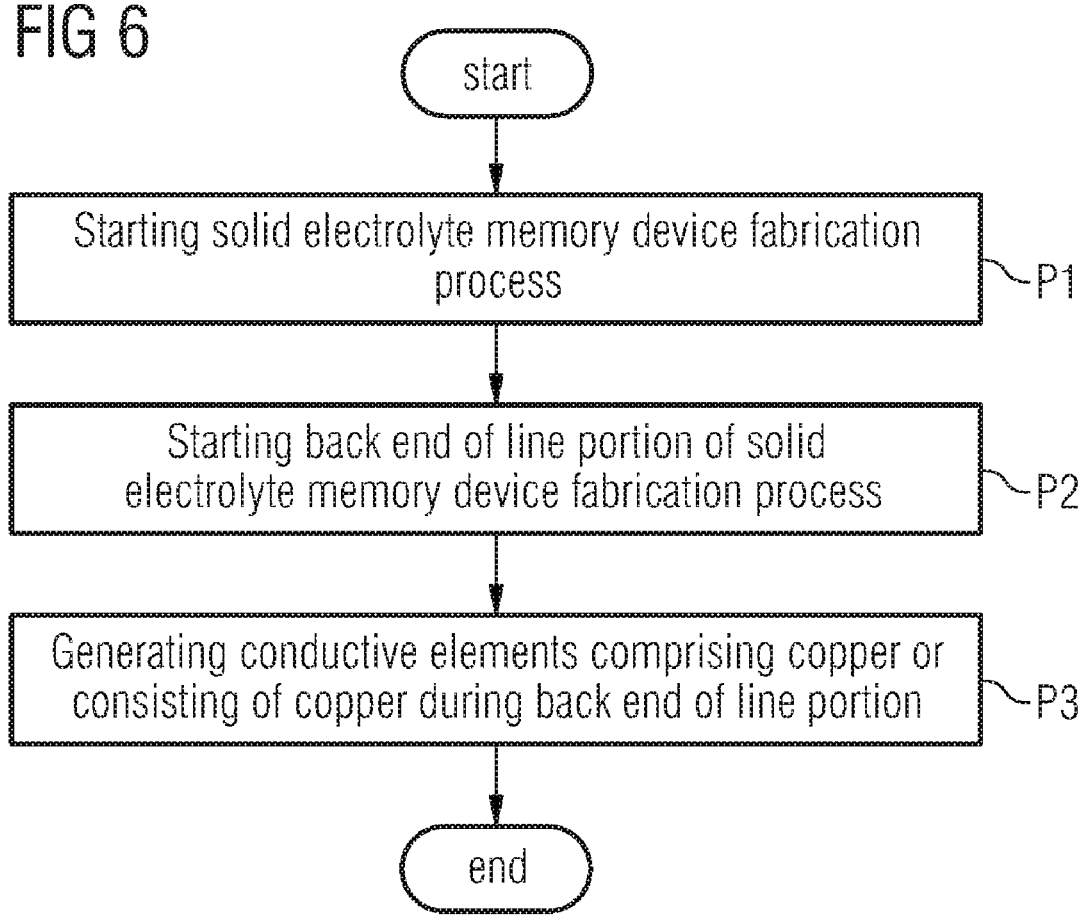

INTEGRATED CIRCUIT, RESISTIVITY CHANGING MEMORY DEVICE, MEMORY MODULE AND METHOD OF FABRICATING AN INTEGRATED CIRCUIT

BRIEF DESCRIPTION OF THE DRAWINGS

For a more complete understanding of exemplary embodiments of the present invention and the effects thereof, reference is now made to the following description taken in conjunction with the accompanying drawings, in which:

FIG. 1A shows a schematic cross-sectional view of a solid electrolyte memory device set to a first switching state;

FIG. 1B shows a schematic cross-sectional view of a solid electrolyte memory device set to a second switching state;

FIG. 2 shows a schematic cross-sectional view of a part of a solid electrolyte memory device;

FIG. 3 shows a schematic cross-sectional view of a part of one embodiment of the solid electrolyte memory device according to the present invention;

FIG. 4 shows a schematic cross-sectional view of a part of one embodiment of the solid electrolyte memory device according to the present invention;

FIG. 5 shows a schematic cross-sectional view of a part of one embodiment of the solid electrolyte memory device according to the present invention;

FIG. 6 shows a flow chart diagram of one embodiment of the fabricating method according to the present invention;

DETAILED DESCRIPTION OF ILLUSTRATIVE EMBODIMENTS

Figure 7A:
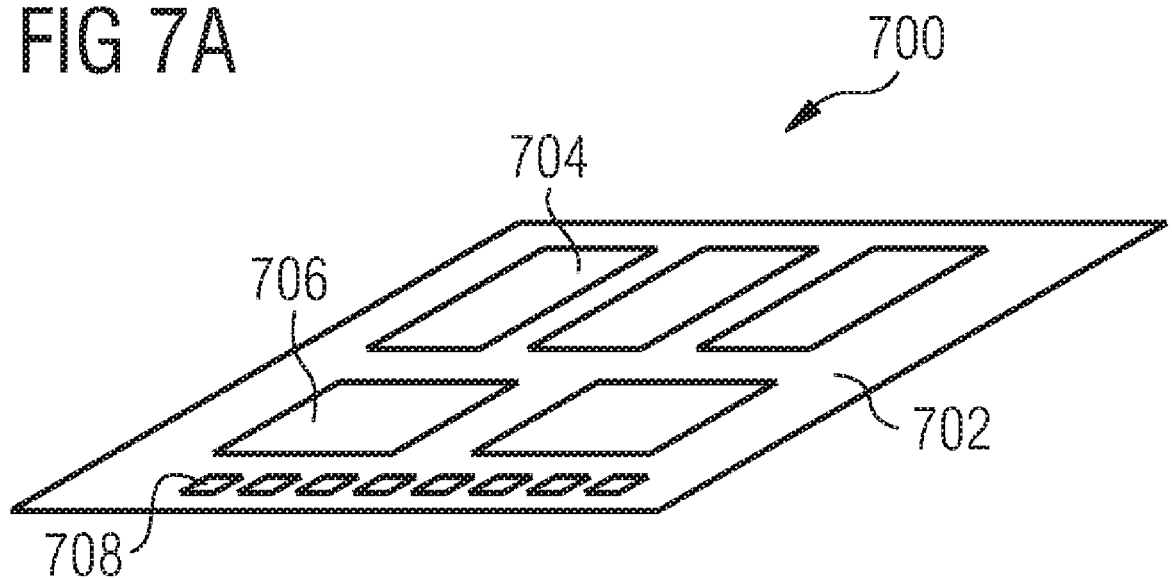
FIG. 7A shows a memory module according to one embodiment of the present invention.

For sake of simplicity, it will be assumed in the following description that the memory device is a solid electrolyte memory device (resistivity changing memory device). However, the present invention is not restricted thereto. The embodiments of the present invention can also be applied to other types of resistivity changing memory devices like PCRAM (phase changing random access memory) devices or ORAM (organic random access memory) devices.

According to one embodiment of the present invention, an integrated circuit including solid electrolyte memory device includes a plurality of solid electrolyte memory cells and a plurality of conductive elements being electrically connected to the solid electrolyte memory cells, at least some of the conductive elements including copper.

According to one embodiment of the present invention, a solid electrolyte memory device includes a plurality of solid electrolyte memory cells and a plurality of conductive elements being electrically connected to the solid electrolyte memory cells, at least some of the conductive elements including copper.

According to one embodiment of the present invention, a solid electrolyte memory device includes conductive elements which are generated during a back end of line portion of the memory device fabrication. At least some of the conductive elements include copper.

An effect of conductive elements including copper is that no high temperature annealing process is needed during the back end of line portion of the memory device fabrication in order to generate the conductive elements. As a consequence, the risk that the solid electrolyte layer of the solid electrolyte memory device delaminates (mainly caused by mechanical stress of the conductive elements during the high temperature annealing process) can be significantly reduced. A further effect is that the contact performance (electrical contacts between conductive elements and materials surrounding the conductive elements) of conductive elements including copper is relatively high.

According to one embodiment of the present invention, at least some of the conductive elements guide electric currents or voltages through the memory device.

According to one embodiment of the present invention, at least some of the conductive elements guide electric currents or voltages between a common memory cell top electrode or a plurality of memory cell top electrodes and a memory cell programming (writing) unit or a memory cell reading unit.

According to one embodiment of the present invention, at least some of the conductive elements guide electric currents or voltages between a substrate of the memory device and a substrate voltage/current terminal.

According to one embodiment of the present invention, the conductive elements guide the electric currents or voltages between a substrate of the memory device and a substrate voltage/current terminal being arranged within a peripheral area of the memory device.

According to one embodiment of the present invention, at least some of the conductive elements are plugs.

According to one embodiment of the present invention, at least some of the conductive elements are vias.

According to one embodiment of the present invention, at least some of the conductive elements are at least parts of wiring layers of the memory device.

According to one embodiment of the present invention, at least some of the conductive elements are at least partially surrounded by adhesive material.

According to one embodiment of the present invention, the adhesive material is TaN.

According to one embodiment of the present invention, at least some of the conductive elements consist of copper.

According to one embodiment of the present invention, all conductive elements consist of copper.

According to one embodiment of the present invention, all wiring layers, plugs and vias generated during the back end of line portion of the memory device fabrication consist of copper.

According to one embodiment of the present invention, the uppermost conductive element is an AlCu pad electrode contactable by bond wires.

According to one embodiment of the present invention, a resistivity changing memory device includes a plurality of resistivity changing memory means and a plurality of conductive means being electrically connected to the resistivity changing memory means, at least some of the conductive means including copper. The resistivity changing memory means may, for example, be a resistivity changing memory cell, the conductive means may, for example, be a conductive connection.

According to one embodiment of the present invention, an integrated circuit including a solid electrolyte memory device includes conductive elements guiding the electric currents or voltages between a substrate of the memory device and a substrate voltage/current terminal being arranged within a peripheral area of the memory device, at least some of the conductive elements including copper.

According to one embodiment of the present invention, an integrated circuit having a solid electrolyte memory device includes a memory cell region and a peripheral region, the memory device further including conductive wiring layers, conductive plugs or conductive vias being arranged within the memory cell region and the peripheral region. The wiring layers, plugs and vias consist of copper, respectively. The wiring layers, plugs and vias are arranged within the memory cell region guiding electric currents supplied to the memory cells or received from the memory cells. The wiring layers, plugs and vias are arranged within the periphery region guiding electric currents supplied to or received from a substrate of the memory device.

According to an embodiment of the present invention, a memory module is provided including at least a resistivity changing memory device according to one embodiment described above. According to one embodiment of the present invention, the memory module is stackable.

According to one embodiment of the present invention, the wiring layers, plugs or vias are fabricated during a back and of line process.

According to one embodiment of the present invention, a method of fabricating an integrated circuit including a solid electrolyte memory device is provided, the fabricating method including a back end of line fabrication portion (process), wherein, during the back end of line fabrication portion (process), conductive elements are generated, at least some of the conductive elements including copper.

According to one embodiment of the present invention, the back end of line fabrication portion (process) includes generating conductive elements which guide electric currents or voltages through the memory device.

According to one embodiment of the present invention, the back end of line fabrication portion (process) includes generating conductive elements which guide electric currents or voltages between a common memory cell top electrode or a plurality of memory cell top electrodes and a memory cell writing unit or a memory cell reading unit.

According to one embodiment of the present invention, the back end of line fabrication portion (process) includes generating conductive elements guiding electric currents or voltages between a substrate of the memory device and a substrate voltage/current terminal.

According to one embodiment of the present invention, the conductive elements guiding electric currents or voltages between a substrate of the memory device and a substrate voltage/current terminal are generated within a peripheral area of the memory device.

According to one embodiment of the present invention, at least some of the conductive elements generated are plugs.

According to one embodiment of the present invention, at least some of the conductive elements generated are vias.

According to one embodiment of the present invention, at least some of the conductive elements generated are at least parts of wiring layers of the memory device.

According to one embodiment of the present invention, the back end of line fabrication portion (process) includes generating adhesive material which at least partially surrounds at least some conductive elements.

According to one embodiment of the present invention, the adhesive material is TaN.

According to one embodiment of the present invention, the back end of line fabrication portion (process) includes generating conductive elements which consist of copper.

According to one embodiment of the present invention, the back end of line fabrication portion (process) is carried out such that all wiring layers, plugs and vias generated during the back end of line portion consist of copper.

According to one embodiment of the present invention, the back end of line fabrication portion (process) includes an annealing process during which the conductive elements are annealed.

According to one embodiment of the present invention, the annealing temperature of the annealing process lies below 350° C.

According to one embodiment of the present invention, a method of fabricating an integrated circuit having a solid electrolyte memory device including a memory cell region and a peripheral region is provided, the fabricating method including a fabrication portion (process) during which conductive wiring layers, conductive plugs or conductive vias are generated within the memory cell region and the peripheral region, the fabrication portion (process) being carried out such that: all wiring layers, plugs and vias being generated consist of copper, respectively; the wiring layers, plugs and vias being generated within the memory cell region guide electric currents or voltages being supplied to the memory cells or being received from the memory cells; the wiring layers, plugs and vias being generated within the periphery region guide electric currents or voltages being supplied to or being received from a substrate of the memory device.

According to one embodiment of the present invention, the fabrication portion (process) is a back end of line fabrication portion (process).

Since the embodiments of the present invention can be applied to solid electrolyte devices like CBRAM (conductive bridging random access memory) devices, in the following description, making reference to FIGS. 1A and 1B, a basic principle underlying CBRAM devices will be explained. Of course, the embodiments of the present invention can also be applied to other types of resistive memory devices like PCRAM (phase changing random access memory) devices or ORAM (organic random access memory) devices.

As shown in FIG. 1A, a CBRAM cell 100 includes a first electrode 101 a second electrode 102, and a solid electrolyte block (in the following also referred to as ion conductor block) 103 which includes the active material and which is sandwiched between the first electrode 101 and the second electrode 102. This solid electrolyte block 103 can also be shared between a large number of memory cells (not shown here). The first electrode 101 contacts a first surface 104 of the ion conductor block 103, the second electrode 102 contacts a second surface 105 of the ion conductor block 103. The ion conductor block 103 is isolated against its environment by an isolation structure 106. The first surface 104 usually is the top surface, the second surface 105 the bottom surface of the ion conductor 103. In the same way, the first electrode 101 generally is the top electrode, and the second electrode 102 the bottom electrode of the CBRAM cell. One of the first electrode 101 and the second electrode 102 is a reactive electrode, the other one an inert electrode. Here, the first electrode 101 is the reactive electrode, and the second electrode 102 is the inert electrode. In this example, the first electrode 101 includes silver (Ag), the ion conductor block 103 includes silver-doped chalcogenide material, the second electrode 102 includes tungsten (W), and the isolation structure 106 includes $SiO_2$. The present invention is however not restricted to these materials. For example, the first electrode 101 may alternatively or additionally include copper (Cu) or zink (Zn), and the ion conductor block 103 may alternatively or additionally include copper-doped chalcogenide material. Further, the second electrode 102 may alternatively or additionally include nickel (Ni) or platinum (Pt), iridium (Ir), rhenium (Re), tantalum (Ta), titanium (Ti), ruthenium (Ru), molybdenum (Mo), vanadium (V), conductive oxides, silicides, and nitrides of the aforementioned compounds, and can also include alloys of the aforementioned metals or materials. The thickness of the ion conductor 103 may, for example, range between 5 nm and 500 nm. The thickness of the first electrode 101 may, for example, range between 10 nm and 100 nm. The thickness of the second electrode 102 may, for example, range between 5 nm and 500 nm, between 15 nm to 150 nm, or between 25 nm and 100 nm. It is to be understood that the present invention is not restricted to the above-mentioned materials and thicknesses.

In the context of this description, chalcogenide material (ion conductor) is to be understood for example as any compound containing oxygen, sulphur, selenium, germanium and/or tellurium. In accordance with one embodiment of the invention, the ion conducting material is for example a compound, which is made of a chalcogenide and at least one metal of the group I or group II of the periodic system, for example arsenic-trisulfide-silver. Alternatively, the chalcogenide material contains germanium-sulfide ($GeS_x$), germanium-selenide ($GeSe_x$), tungsten oxide ($WO_x$), copper sulfide ($CuS_x$) or the like. The ion conducting material may be a solid state electrolyte. Furthermore, the ion conducting material can be made of a chalcogenide material containing metal ions, wherein the metal ions can be made of a metal, which is selected from a group consisting of silver, copper and zinc or of a combination or an alloy of these metals.

If a voltage as indicated in FIG. 1A is applied across the ion conductor block 103, a redox reaction is initiated which drives $Ag^+$ ions out of the first electrode 101 into the ion conductor block 103 where they are reduced to Ag, thereby forming Ag rich clusters 108 within the ion conductor block 103. If the voltage applied across the ion conductor block 103 is applied for an enhanced period of time, the size and the number of Ag rich clusters within the ion conductor block 103 is increased to such an extent that a conductive bridge 107 between the first electrode 101 and the second electrode 102 is formed. In case that a voltage is applied across the ion conductor 103 as shown in FIG. 1B (inverse voltage compared to the voltage applied in FIG. 1A), a redox reaction is initiated which drives $Ag^+$ ions out of the ion conductor block 103 into the first electrode 101 where they are reduced to Ag. As a consequence, the size and the number of Ag rich clusters within the ion conductor block 103 is reduced, thereby erasing the conductive bridge 107.

In order to determine the current memory status of a CBRAM cell, for example, a sensing current is routed through the CBRAM cell. The sensing current experiences a high resistance in case no conductive bridge 107 exists within the CBRAM cell, and experiences a low resistance in case a conductive bridge 107 exists within the CBRAM cell. A high resistance may, for example, represent "0", whereas a low resistance represents "1", or vice versa. The memory status detection may also be carried out using sensing voltages.

FIG. 2 shows an embodiment 200 of a solid electrolyte memory device. A solid electrolyte memory device 200 includes a semiconductor substrate 201, above which first vias 202, word lines 203, gate electrodes 204, first isolation elements 205 and a first isolation layer 206 are provided, the first vias 202, word lines 203 and gate electrodes 204 being embedded into the first isolation layer 206 in order to isolate the first vias 202, word lines 203 and gate electrodes 204 against each other. The first isolation elements 205 isolate the gate electrodes 204 against the semiconductor substrate 201.

The solid electrolyte memory device 200 further comprises a second isolation layer 207 and a third isolation layer 208 arranged in this order on the first isolation layer 206. Bit lines 209 which contact first vias 202, second vias 210, a first wiring layer 211, a first plug 212, a second plug 213, and a third plug 214 are embedded into the second isolation layer 207 and the third isolation layer 208. The first plug 212, the second plug 213, and the third plug 214 are partly surrounded by interface material 215 which may be adhesive material and/or conductive material and/or insulating material. A fourth isolation layer 216, a fifth isolation layer 217, and a sixth isolation layer 218 are arranged on the third isolation layer 208 in this order. A third via 219 partially surrounded by interface material 215 (for example, tantalum or tantalum nitride (Ta/TaN)) is embedded into the composite structure formed by the fourth isolation layer 216, the fifth isolation layer 217, and the sixth isolation layer 218. Further, a solid electrolyte cell unit 221 is embedded into said composite structure. The solid electrolyte cell unit 221 comprises a fourth plug 222 functioning as bottom electrode of the solid electrolyte cell unit 221 and being partially surrounded by interface material 215, a layer of active material 223 (for example, chalcogenide material), a common top electrode layer 224 (for example, a silver layer) arranged on the active material layer 223, a common contacting layer 225 arranged on the common top electrode layer 224, and a fifth plug 241 being arranged on the common contacting layer 225 and being partially surrounded by the interface material 215. A seventh isolation layer 226 and an eighth isolation layer 227 are arranged on the sixth isolation layer 218 in this order. A second wiring layer 228 is embedded into the seventh isolation layer 226 and is partially surrounded by interface material 215. A sixth plug 229 is embedded into the eighth isolation layer 227 and is partially surrounded by interface material 215. A third wiring layer 231 is arranged on the eighth isolation layer 227 and is partially surrounded by interface material 215. The upper surface of the eighth isolation layer 227 as well as parts of the surface of the third wiring layer 231 are covered with a ninth isolation layer 232 and a tenth isolation layer 233.

The third wiring layer 231, the sixth plug 229, the second wiring layer 228, the third via 219, the second plug 213, the first plug 212, the first wiring layer 211, and some of the first vias 202 may be connected in a way that a conductive line is formed which guides electric currents between the semiconductor substrate 201 of the solid electrolyte memory device 200 and a substrate voltage/current terminal which is formed by the upper surface of the third wiring layer 231.

The fifth plug 241 and the second wiring layer 228 may be connected in a way that a conductive line is formed which guides electric currents or voltages between the common contacting layer 225 and a memory cell programming unit (not shown here) programming memory states of the memory cells or between the common contacting layer 225 and a memory cell reading unit (not shown here) determining the memory state of the memory cells. For sake of simplicity, only one fifth plug 241 is shown. However, a plurality of fifth plugs 241 may be provided, each fifth plug 241 being part of a conductive line guiding electric currents or voltages between the common contacting layer 225 and a memory cell programming unit/a memory cell reading unit. Further, the common contacting layer 225 and the common top electrode layer 224 may be patterned.

The third wiring layer 231, the sixth plug 229, the second wiring layer 228, the third via 219, the second plug 213, the first plug 212, and the first wiring layer 211 are located within a peripheral area 242 of the solid electrolyte memory device 200, whereas the fifth plug 241 and the second wiring layer 228 are located within a cell area 243 of the solid electrolyte memory device 200.

In the solid electrolyte memory device 200, all plugs, vias and wiring layers consist of aluminum (Al) or tungsten (W). In order to insure a high contact performance of the conductive elements (electrical contacts between conductive elements and materials surrounding the conductive elements) including aluminum or tungsten or conductive elements consisting of said materials, the conductive elements (in particular the second wiring layer 228) are annealed. As a consequence, the active material layer 223 may delaminate due to mechanical stress occurring within the solid electrolyte memory device 200 during the annealing process.

FIG. 3 shows an embodiment of a solid electrolyte memory device according to the present invention avoiding this effect. The solid electrolyte memory device 300 shown in FIG. 3 has the same architecture as that of the solid electrolyte memory device 200 shown in FIG. 2 (and may have the same modifications as discussed in conjunction with the solid electrolyte memory device 200). The only difference is that some of the conductive elements (plugs, vias, wiring layers) which are fabricated during the back end of line portion of the fabrication process of the solid electrolyte memory device 300 (in this embodiment, the third wiring layer 231, the sixth plug 229, the second wiring layer 228, the third via 219 and the fifth plug 241 are fabricated during the back end of line portion) comprise copper or consist of copper (Co). In this embodiment, only the third via 219 and the fifth plug 241 comprise copper or consist of copper. In order to insure a good contact performance, a low temperature annealing process annealing the fifth plug 241 and the third via 219 is sufficient. For example, a low temperature annealing process at temperatures lying below 350° C. or even 335° C. may be sufficient. If the third via 219 the fifth plug 241 consisted of aluminum or tungsten, temperatures about 400° C. to 430° C. would have to be used.

Of course, arbitrary conductive elements generated during the back end of line portion may comprise copper or consist of copper. FIG. 4 shows, for example, a solid electrolyte memory device 400 in which all conductive elements generated during the back and of line portion comprise copper or consist of copper (the third wiring layer 231, the sixth plug 229, the second wiring layer 228, the third via 219 and the fifth plug 241). In addition, a pad electrode 401 consisting of aluminum and copper is provided on the third wiring layer 231. A part of the upper surface of the pad electrode 401 serves as contact area, which may, for example, be contacted by bond wires. It has to be mentioned that also the third plug 214 and the fourth plug 222 may comprise copper or consist of copper. Further, the first wiring layer 211, the first plug 212, and the second plug 213 may comprise copper or consist of copper. In this case, a tungsten interface layer may be provided between the first vias 202 and the first wiring layer 211, and between the second vias 210 and the third plug 214.

FIG. 5 shows one embodiment of the solid electrolyte memory device according to the present invention. A solid electrolyte memory device 500 comprises a first part 501 fabricated before a back end of line process, and a second part 502 fabricated during a back end of line process. The second part 502 comprises conductive elements 503, each of which comprising copper or consisting of copper.

FIG. 6 shows an embodiment of the fabricating method according to the present invention. In a first process P1, the solid electrolyte memory device fabrication process is started (for example, a memory cell array is provided on a substrate). Then, in a second process P2, a back end of line portion of the solid electrolyte memory device fabrication process is started. During the back end of line portion, conductive elements comprising copper or consisting of copper are generated during a third process P3.

Figure 7B:
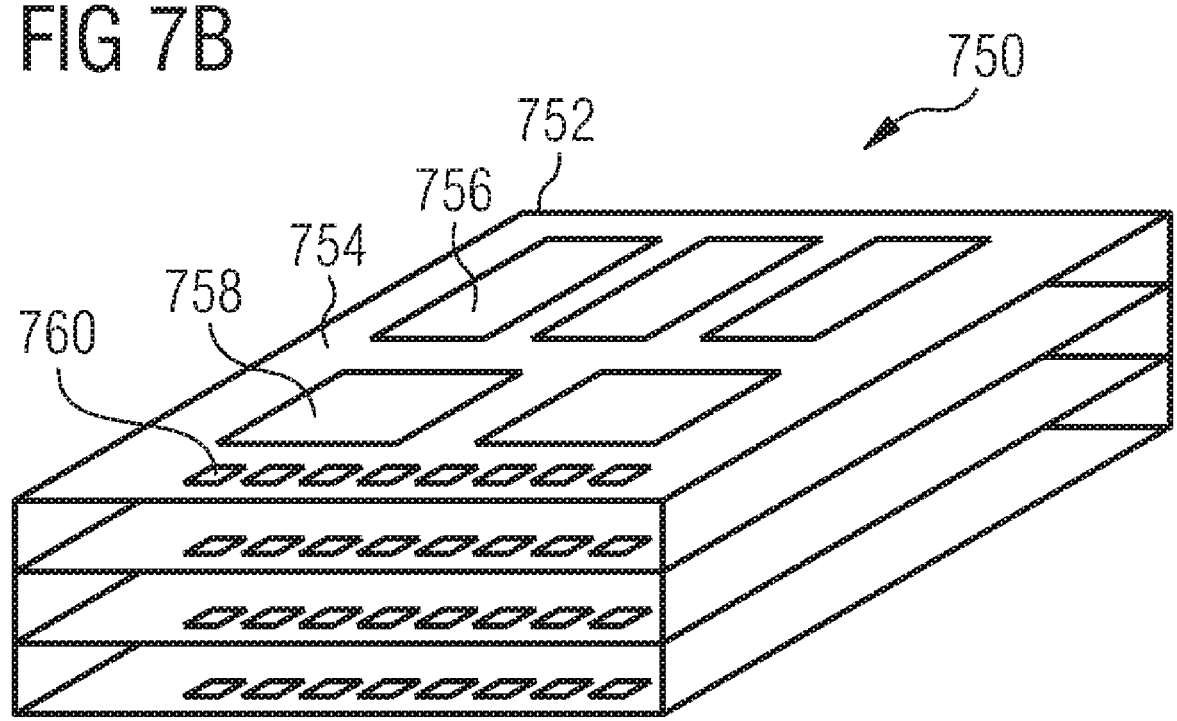
FIG. 7B shows a memory module according to one embodiment of the present invention.

As shown in FIGS. 7A and 7B, in some embodiments, memory devices such as those described herein may be used in modules. In FIG. 7A, a memory module 700 is shown, on which one or more memory devices/integrated circuits 704 according to one embodiment of the present invention are arranged on a substrate 702. The memory device/integrated circuit 704 may include numerous memory cells. The memory module 700 may also include one or more electronic devices 706, which may include memory, processing circuitry, control circuitry, addressing circuitry, bus interconnection circuitry, or other circuitry or electronic devices that may be combined on a module with a memory device, such as the memory device/integrated circuit 704. Additionally, the memory module 700 includes multiple electrical connections 708, which may be used to connect the memory module 700 to other electronic components, including other modules.

As shown in FIG. 7B, in some embodiments, these modules may be stackable, to form a stack 750. For example, a stackable memory module 752 may contain one or more memory devices 756, arranged on a stackable substrate 754. The memory device 756 contains memory cells that employ memory elements in accordance with an embodiment of the invention. The stackable memory module 752 may also include one or more electronic devices 758, which may include memory, processing circuitry, control circuitry, addressing circuitry, bus interconnection circuitry, or other circuitry or electronic devices that may be combined on a module with a memory device, such as the memory device 756. Electrical connections 760 are used to connect the stackable memory module 752 with other modules in the stack 750, or with other electronic devices. Other modules in the stack 750 may include additional stackable memory modules, similar to the stackable memory module 752 described above, or other types of stackable modules, such as stackable processing modules, control modules, communication modules, or other modules containing electronic components.

According to one embodiment of the present invention, the reliability of integrated circuits having a resistivity changing memory device is improved.

According to one embodiment of the invention, the resistivity changing memory cells are phase changing memory cells that include a phase changing material. The phase changing material can be switched between at least two different crystallization states (i.e., the phase changing material may adopt at least two different degrees of crystallization), wherein each crystallization state may be used to represent a memory state. When the number of possible crystallization states is two, the crystallization state having a high degree of crystallization is also referred to as "crystalline state", whereas the crystallization state having a low degree of crystallization is also referred to as "amorphous state". Different crystallization states can be distinguished from each other by their differing electrical properties, and in particular by their different resistances. For example, a crystallization state having a high degree of crystallization (ordered atomic structure) generally has a lower resistance than a crystallization state having a low degree of crystallization (disordered atomic structure). For sake of simplicity, it will be assumed in the following that the phase changing material can adopt two crystallization states (an "amorphous state" and a "crystalline state"), however it will be understood that additional intermediate states may also be used.

Phase changing memory cells may change from the amorphous state to the crystalline state (and vice versa) due to temperature changes of the phase changing material. These temperature changes may be caused using different approaches. For example, a current may be driven through the phase changing material (or a voltage may be applied across the phase changing material). Alternatively, a current or a voltage may be fed to a resistive heater which is disposed adjacent to the phase changing material. To determine the memory state of a resistivity changing memory cell, a sensing current may routed through the phase changing material (or a sensing voltage may be applied across the phase changing material), thereby sensing the resistivity of the resistivity changing memory cell, which represents the memory state of the memory cell.

Figure 8:
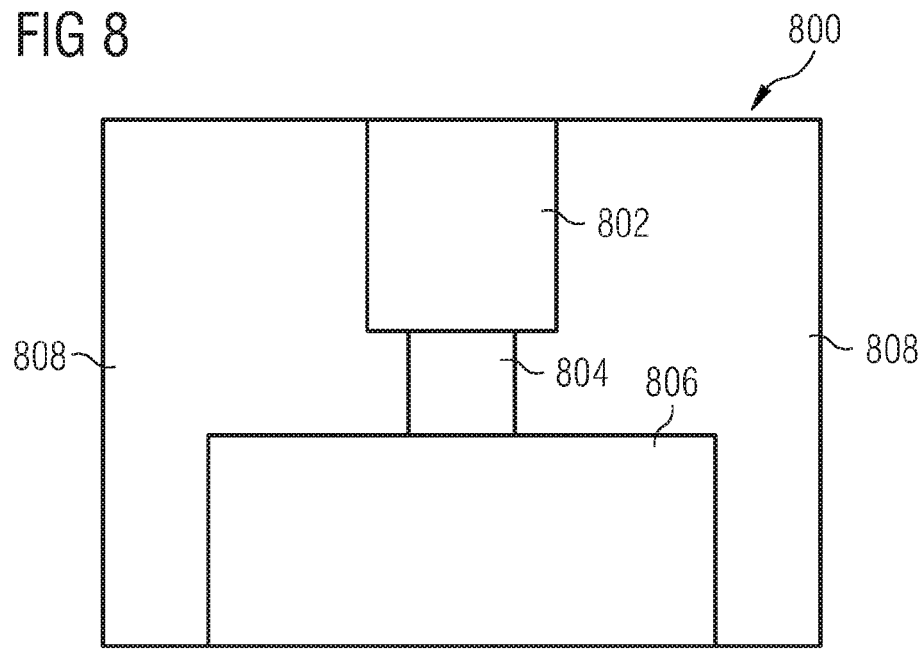
FIG. 8 shows a cross-sectional view of a phase changing memory cell.

FIG. 8 illustrates a cross-sectional view of an exemplary phase changing memory cell 800 (active-in-via type). The phase changing memory cell 800 includes a first electrode 806, a phase changing material 804, a second electrode 802, and an insulating material 808. The phase changing material 804 is laterally enclosed by the insulating material 808. To use the phase changing memory cell in a memory cell, a selection device (not shown), such as a transistor, a diode, or another active device, may be coupled to the first electrode 806 or to the second electrode 802 to control the application of a current or a voltage to the phase changing material 804 via the first electrode 806 and/or the second electrode 802. To set the phase changing material 804 to the crystalline state, a current pulse and/or voltage pulse may be applied to the phase changing material 804, wherein the pulse parameters are chosen such that the phase changing material 804 is heated above its crystallization temperature, while keeping the temperature below the melting temperature of the phase changing material 804. To set the phase changing material 804 to the amorphous state, a current pulse and/or voltage pulse may be applied to the phase changing material 804, wherein the pulse parameters are chosen such that the phase changing material 804 is quickly heated above its melting temperature, and is quickly cooled.

The phase changing material 804 may include a variety of materials. According to one embodiment, the phase changing material 804 may include or consist of a chalcogenide alloy that includes one or more cells from group VI of the periodic table. According to another embodiment, the phase changing material 804 may include or consist of a chalcogenide compound material, such as GeSbTe, SbTe, GeTe or AgInSbTe. According to a further embodiment, the phase changing material 804 may include or consist of chalcogen free material, such as GeSb, GaSb, InSb, or GeGaInSb. According to still another embodiment, the phase changing material 804 may include or consist of any suitable material including one or more of the cells Ge, Sb, Te, Ga, Bi, Pb, Sn, Si, P, O, As, In, Se, and S.

According to one embodiment, at least one of the first electrode 806 and the second electrode 802 may include or consist of Ti, V, Cr, Zr, Nb, Mo, Hf, Ta, W, or mixtures or alloys thereof. According to another embodiment, at least one of the first electrode 806 and the second electrode 802 may include or consist of Ti, V, Cr, Zr, Nb, Mo, Hf, Ta, W and two or more cells selected from the group consisting of B, C, N, O, Al, Si, P, S, and/or mixtures and alloys thereof. Examples of such materials include TiCN, TiAlN, TiSiN, W—$Al_2O_3$ and Cr—$Al_2O_3$.

Figure 9:
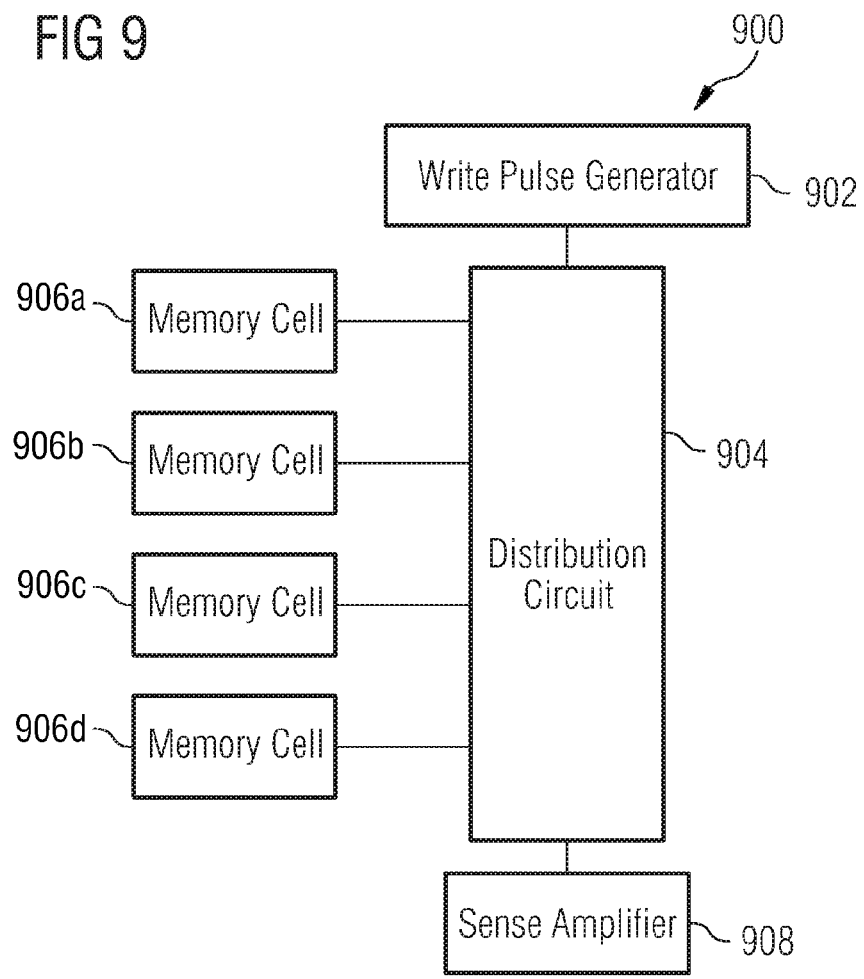
FIG. 9 shows a schematic drawing of a memory device including resistivity changing memory cells.

FIG. 9 illustrates a block diagram of a memory device 900 including a write pulse generator 902, a distribution circuit 904, phase changing memory cells 906a, 906b, 906c, 906d (for example phase changing memory cells 200 as shown in FIG. 2), and a sense amplifier 908. According to one embodiment, a write pulse generator 902 generates current pulses or voltage pulses that are supplied to the phase changing memory cells 906a, 906b, 906c, 906d via the distribution circuit 904, thereby programming the memory states of the phase changing memory cells 906a, 906b, 906c, 906d. According to one embodiment, the distribution circuit 904 includes a plurality of transistors that supply direct current pulses or direct voltage pulses to the phase changing memory cells 906a, 906b, 906c, 906d or to heaters being disposed adjacent to the phase changing memory cells 906a, 906b, 906c, 906d.

As already indicated, the phase changing material of the phase changing memory cells 906a, 906b, 906c, 906d may be changed from the amorphous state to the crystalline state (or vice versa) under the influence of a temperature change. More generally, the phase changing material may be changed from a first degree of crystallization to a second degree of crystallization (or vice versa) under the influence of a temperature change. For example, a bit value "0" may be assigned to the first (low) degree of crystallization, and a bit value "1" may be assigned to the second (high) degree of crystallization. Since different degrees of crystallization imply different electrical resistances, the sense amplifier 908 is capable of determining the memory state of one of the phase changing memory cells 906a, 906b, 906c, or 906d in dependence on the resistance of the phase changing material.

To achieve high memory densities, the phase changing memory cells 906a, 906b, 906c, 906d may be capable of storing multiple bits of data, i.e., the phase changing material may be programmed to more than two resistance values. For example, if a phase changing memory cell 906a, 906b, 906c, 906d is programmed to one of three possible resistance levels, 1.5 bits of data per memory cell can be stored. If the phase changing memory cell is programmed to one of four possible resistance levels, two bits of data per memory cell can be stored, and so on.

The embodiment shown in FIG. 9 may also be applied in a similar manner to other types of resistivity changing memory cells like programmable metallization cells (PMCs), magento-resistive memory cells (e.g., MRAMs) or organic memory cells (e.g., ORAMs).

Another type of resistivity changing memory cell may be formed using carbon as a resistivity changing material. Generally, amorphous carbon that is rich is $sp^3$-hybridized carbon (i.e., tetrahedrally bonded carbon) has a high resistivity, while amorphous carbon that is rich in $sp^2$-hybridized carbon (i.e., trigonally bonded carbon) has a low resistivity. This difference in resistivity can be used in a resistivity changing memory cell.

In one embodiment, a carbon memory cell may be formed in a manner similar to that described above with reference to phase changing memory cells. A temperature-induced change between an $sp^3$-rich state and an $sp^2$-rich state may be used to change the resistivity of an amorphous carbon material. These differing resistivities may be used to represent different memory states. For example, a high resistance $sp^3$-rich state can be used to represent a "0", and a low resistance $sp^2$-rich state can be used to represent a "1". It will be understood that intermediate resistance states may be used to represent multiple bits, as discussed above.

Generally, in this type of carbon memory cell, application of a first temperature causes a change of high resistivity $sp^3$-rich amorphous carbon to relatively low resistivity $sp^2$-rich amorphous carbon. This conversion can be reversed by application of a second temperature, which is typically higher than the first temperature. As discussed above, these temperatures may be provided, for example, by applying a current and/or voltage pulse to the carbon material. Alternatively, the temperatures can be provided by using a resistive heater that is disposed adjacent to the carbon material.

Another way in which resistivity changes in amorphous carbon can be used to store information is by field-strength induced growth of a conductive path in an insulating amorphous carbon film. For example, applying voltage or current pulses may cause the formation of a conductive $sp^2$ filament in insulating $sp^3$-rich amorphous carbon. The operation of this type of resistive carbon memory is illustrated in FIGS. 10A and 10B.

Figure 10A:
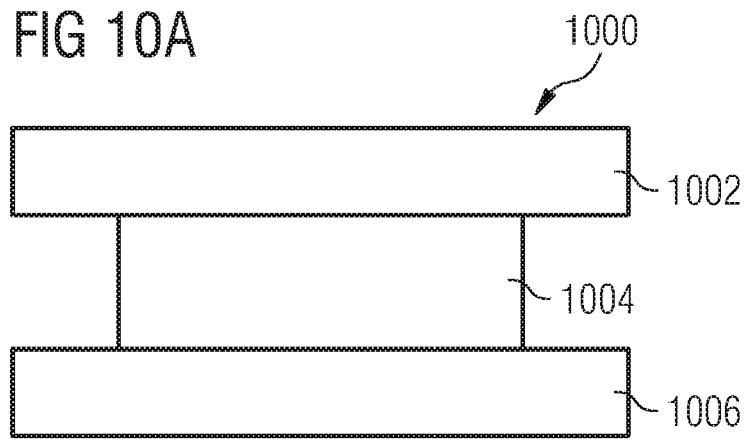
FIG. 10A shows a cross-sectional view of a carbon memory cell set to a first switching state.
Figure 10B:
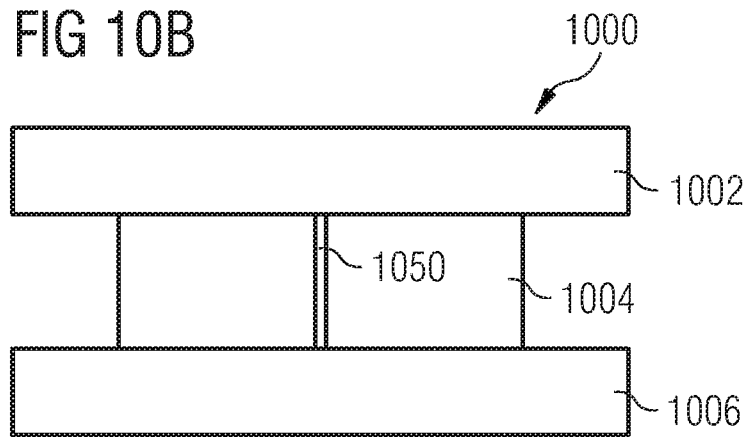
FIG. 10B shows a cross-sectional view of a carbon memory cell set to a second switching state.

FIG. 10A shows a carbon memory cell 1000 that includes a top contact 1002, a carbon storage layer 1004 including an insulating amorphous carbon material rich in $sp^3$-hybridized carbon atoms, and a bottom contact 1006. As shown in FIG. 10B, by forcing a current (or voltage) through the carbon storage layer 1004, an $sp^2$ filament 1050 can be formed in the $sp^3$-rich carbon storage layer 1004, changing the resistivity of the memory cell. Application of a current (or voltage) pulse with higher energy (or, in some embodiments, reversed polarity) may destroy the $sp^2$ filament 1050, increasing the resistance of the carbon storage layer 1004. As discussed above, these changes in the resistance of the carbon storage layer 1004 can be used to store information, with, for example, a high resistance state representing a "0" and a low resistance state representing a "1". Additionally, in some embodiments, intermediate degrees of filament formation or formation of multiple filaments in the $sp^3$-rich carbon film may be used to provide multiple varying resistivity levels, which may be used to represent multiple bits of information in a carbon memory cell. In some embodiments, alternating layers of $sp^3$-rich carbon and $sp^2$-rich carbon may be used to enhance the formation of conductive filaments through the $sp^3$-rich layers, reducing the current and/or voltage that may be used to write a value to this type of carbon memory.

Figure 11A:
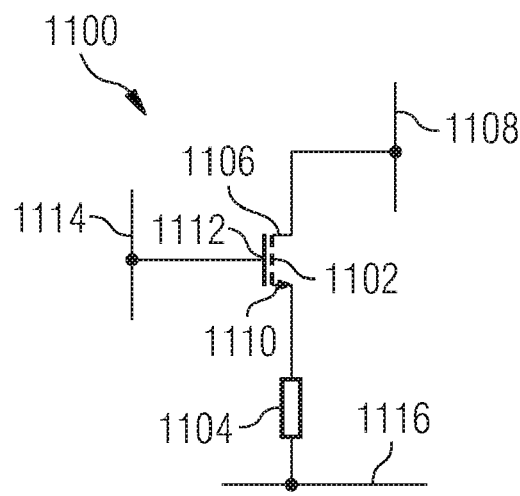
FIG. 11A shows a schematic drawing of a resistivity changing memory cell.

Resistivity changing memory cells, such as the phase changing memory cells and carbon memory cells described above, may include a transistor, diode, or other active component for selecting the memory cell. FIG. 11A shows a schematic representation of such a memory cell that uses a resistivity changing memory element. The memory cell 1100 includes a select transistor 1102 and a resistivity changing memory element 1104. The select transistor 1102 includes a source 1106 that is connected to a bit line 1108, a drain 1110 that is connected to the memory element 1104, and a gate 1112 that is connected to a word line 1114. The resistivity changing memory element 1104 also is connected to a common line 1116, which may be connected to ground, or to other circuitry, such as circuitry (not shown) for determining the resistance of the memory cell 1100, for use in reading. Alternatively, in some configurations, circuitry (not shown) for determining the state of the memory cell 1100 during reading may be connected to the bit line 1108. It should be noted that as used herein the terms connected and coupled are intended to include both direct and indirect connection and coupling, respectively.

To write to the memory cell 1100, the word line 1114 is used to select the memory cell 1100, and a current (or voltage) pulse on the bit line 1108 is applied to the resistivity changing memory element 1104, changing the resistance of the resistivity changing memory element 1104. Similarly, when reading the memory cell 1100, the word line 1114 is used to select the cell 1100, and the bit line 1108 is used to apply a reading voltage (or current) across the resistivity changing memory element 1104 to measure the resistance of the resistivity changing memory element 11104.

Figure 11B:
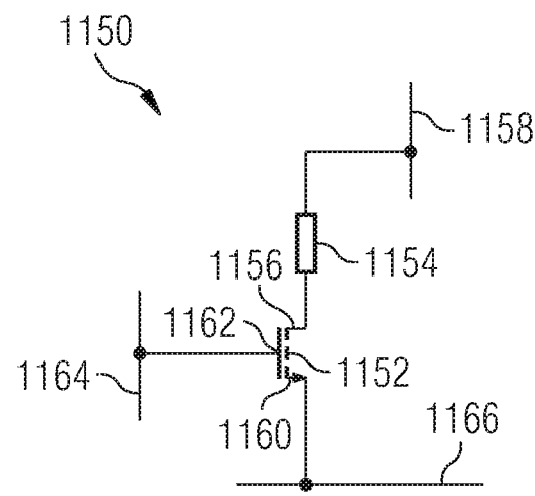
FIG. 11B shows a schematic drawing of a resistivity changing memory cell.

The memory cell 1100 may be referred to as a 1T1J cell, because it uses one transistor, and one memory junction (the resistivity changing memory element 1104). Typically, a memory device will include an array of many such cells. It will be understood that other configurations for a 1T1J memory cell, or configurations other than a 1T1J configuration may be used with a resistivity changing memory element. For example, in FIG. 11B, an alternative arrangement for a 1T1J memory cell 1150 is shown, in which a select transistor 1152 and a resistivity changing memory element 1154 have been repositioned with respect to the configuration shown in FIG. 11A. In this alternative configuration, the resistivity changing memory element 1154 is connected to a bit line 1158, and to a source 1156 of the select transistor 1152. A drain 1160 of the select transistor 1152 is connected to a common line 1166, which may be connected to ground, or to other circuitry (not shown), as discussed above. A gate 1162 of the select transistor 1152 is controlled by a word line 1164.

In the following description, further aspects of exemplary embodiments of the present invention will be explained.

According to one embodiment of the present invention, a CBRAM memory device based on a copper integration scheme is provided, i.e., the connections scheme used after patterning a PL layer uses copper.

According to one embodiment of the present invention, stress migration and electromigration due to unstable aluminum back end of line (BEOL) performance is avoided.

Aluminum BEOL processes usually require a low temperature BEOL without metal anneal in order to ensure that the CBRAM cells work. It can be demonstrated that without an aluminum metal anneal the BEOL wire performance and BEOL contact performance may be unstable, i.e., does not meet the reliability requirements according to the specification.

According to one embodiment of the present invention, the aluminum BEOL process is replaced by a copper BEOL process: the copper integration scheme does not request high temperature annealings and is compatible with the CBRAM requirements, the maximum temperature during the BEOL process can be kept at 335° C.

According to one embodiment of the present invention, after having etched the PL layer, tungsten (W) plugs and aluminum lines normally used are replaced by copper lines and copper vias.

According to one embodiment of the present invention, the plate level and the tungsten (W) contact are connected to the metal line level using copper instead of tungsten (W). In this way, a delamination of the chalcogenide material can be prevented, and the contact resistance performance can be improved.

BEOL processes normally include a tungsten plug process (for the conductive elements "VC" and "C1") to connect aluminum wires to the chalcogenide plate and the tungsten (W) contact below the chalcogenide plate. The CBRAM technology requires to have a low temperature BEOL without metal anneal. Using tungsten (W) as material to fill contact holes (C1 and VC) increases the stress on the wafer and can produce some delamination of the chalcogenide plate. Without any anneal in the BEOL process the C1 contact performance is unstable (low reliability).

According to one embodiment of the present invention, VC tungsten (W) plugs and C1 tungsten (W) plugs are replaced by copper plugs since copper connections provide a better contact performance. After an VC and C1 etch process, the following processes may be performed: copper liner deposition, copper plating, copper bake and copper chemic mechanical polishing (CMP).

As used herein the terms connected and coupled are intended to include both direct and indirect connection and coupling, respectively.

The foregoing description has been presented for purposes of illustration and description. It is not intended to be exhaustive or to limit the invention to the precise form disclosed, and obviously many modifications and variations are possible in light of the disclosed teaching. The described embodiments were chosen in order to best explain the principles of the invention and its practical application to thereby enable others skilled in the art to best utilize the invention in various embodiments and with various modifications as are suited to the particular use contemplated. It is intended that the scope of the invention be defined solely by the claims appended hereto.

What is claimed is:

1. An integrated circuit comprising a resistivity changing memory device, the integrated circuit comprising:
    a plurality of resistivity changing memory cells; and
    a plurality of conductive elements that are electrically connected to the resistivity changing memory cells, at least some of the conductive elements comprising copper;
    wherein the conductive elements guide electric currents or voltages through the memory device; and
    wherein at least some of the conductive elements guide electric currents or voltages between a common memory cell top electrode or a plurality of memory cell top electrodes and a memory cell writing unit or a memory cell reading unit.

2. An integrated circuit comprising a resistivity changing memory device, the integrated circuit comprising:
    a plurality of resistivity changing memory cells:
    a plurality of conductive elements that are electrically connected to the resistivity changing memory cells, at least some of the conductive elements comprising copper, wherein the conductive elements guide electric currents or voltages through the memory device; and
    additional conductive elements guiding electric currents or voltages between a substrate of the memory device and a substrate voltage/current terminal, the additional conductive elements comprising copper.

3. The integrated circuit according to claim 2, wherein the additional conductive elements guide the electric currents or voltages between the substrate of the memory device and the substrate voltage/current terminal that is arranged within a peripheral area of the memory device.

4. The integrated circuit according to claim 2, wherein at least some of the conductive elements comprise plugs.

5. The integrated circuit according to claim 2, wherein at least some of the conductive elements comprise vias.

6. The integrated circuit according to claim 2, wherein at least some of the conductive elements are at least parts of wiring layers of the memory device.

7. The integrated circuit according to claim 1, wherein at least some of the conductive elements are at least partially surrounded by adhesive material.

8. The integrated circuit according to claim 7, wherein the adhesive material comprises TaN.

9. The integrated circuit according to claim 1, wherein at least some of the conductive elements consist of copper.

10. The integrated circuit according to claim 1, wherein all conductive elements comprise copper.

11. An integrated circuit comprising a resistivity changing memory device, the integrated circuit comprising:
    a plurality of resistivity changing memory cells; and
    a plurality of conductive elements that are electrically connected to the resistivity changing memory cells, at least some of the conductive elements comprising copper, wherein all wiring layers, plugs and vias generated during a back end of line portion of the memory device fabrication comprise copper.

12. An integrated circuit comprising a resistivity changing memory device, the integrated circuit comprising:
    a plurality of resistivity changing memory cells; and
    a plurality of conductive elements that are electrically connected to the resistivity changing memory cells, at least some of the conductive elements comprising copper, wherein an uppermost conductive element comprises an AlCu pad electrode contactable by bond wires.

13. The integrated circuit according to claim 1, wherein the resistivity changing memory device comprises a programmable metallization device.

14. The integrated circuit according to claim 13, wherein the programmable metallization device comprises a solid electrolyte memory device.

15. The integrated circuit according to claim 1, wherein the resistivity changing memory device comprises a phase changing device.

16. The integrated circuit according to claim 15, wherein the resistivity changing memory device comprises a carbon memory device.

17. An integrated circuit comprising a resistivity changing memory device, comprising conductive elements guiding electric currents or voltages between a substrate of the memory device and a substrate voltage/current terminal arranged within a peripheral area of the memory device, at least some of the conductive elements comprising copper.

18. An integrated circuit comprising a resistivity changing memory device, the memory device comprising a memory cell region and a peripheral region, the memory device further comprising conductive wiring layers, conductive plugs or conductive vias being arranged within the memory cell region and the peripheral region;
    wherein the wiring layers, plugs and vias consist of copper;
    wherein the wiring layers, plugs and vias are arranged within the memory cell region and guide electric currents supplied to or received from memory cells; and
    wherein the wiring layers, plugs and vias are arranged within the peripheral region and guide electric currents supplied to or received from a substrate of the memory device.

19. The integrated circuit according to claim 18, wherein the wiring layers, plugs or vias are fabricated during a back end of line process.

20. A memory module comprising at least one resistivity changing memory device comprising:
    a plurality of resistivity changing memory cells; and
    a plurality of conductive elements that are electrically connected to the resistivity changing memory cells, at least some of the conductive elements comprising copper;
    wherein the conductive elements guide electric currents or voltages through the memory device; and
    wherein at least some of the conductive elements guide electric currents or voltages between a common memory cell top electrode or a plurality of memory cell top electrodes and a memory cell writing unit or a memory cell reading unit.

21. The memory module according to claim 20, wherein the memory module is stackable.

* * * * *

UNITED STATES PATENT AND TRADEMARK OFFICE
CERTIFICATE OF CORRECTION

PATENT NO.         : 7,599,211 B2
APPLICATION NO.    : 11/733651
DATED              : October 6, 2009
INVENTOR(S)        : Blanchard It is certified that error appears in the above-identified patent and that said Letters Patent is hereby corrected as shown below:

On the Title Page, Item (73) Assignee, insert --Altis Semiconductor SNC, Corbeil Essonnes Cedex (FR)--

Signed and Sealed this

First Day of December, 2009

David J. Kappos
*Director of the United States Patent and Trademark Office*